United States Patent [19]
Beha

[11] Patent Number: 5,420,503
[45] Date of Patent: May 30, 1995

[54] PHASE SEQUENCE INDICATOR

[75] Inventor: Christian Beha, Glottertal, Germany

[73] Assignee: Ch. Beha GmbH, Glottertal, Germany

[21] Appl. No.: 52,583

[22] Filed: Apr. 26, 1993

[30] Foreign Application Priority Data

May 11, 1992 [DE] Germany ............ 9206307.1 U

[51] Int. Cl.6 .................................... G01R 19/14
[52] U.S. Cl. .......................... 324/108; 324/86; 361/76
[58] Field of Search .............. 324/107, 108, 86, 76, 324/77, 556, 133; 361/76, 44; 345/174

[56] References Cited

U.S. PATENT DOCUMENTS

| | | | |
|---|---|---|---|
| 3,215,865 | 11/1965 | Grimme | 307/92 |
| 3,870,950 | 3/1975 | Laas | 324/556 |
| 4,542,433 | 9/1985 | Schaefer | 361/92 |
| 5,153,572 | 10/1992 | Caldwell | 345/174 |

FOREIGN PATENT DOCUMENTS

| | | | |
|---|---|---|---|
| 0100882 | 6/1984 | Japan | 324/86 |
| 1269055 | 11/1986 | U.S.S.R. | 324/86 |

Primary Examiner—Kenneth A. Wieder
Assistant Examiner—Mark Wardas
Attorney, Agent, or Firm—Haynes N. Johnson

[57] ABSTRACT

A phase sequence indicator with two measuring contacts for contacting with connections of the object to be measured has a grouring contact touchable by the user, an evaluation circuit connected to the measuring contacts and the grounding contact, and an indicating device controlled by the evaluation circuit for indicating the direction of the rotary field. The evaluation circuit has a voltage-testing circuit for detecting the value of the voltage occurring between the measuring contacts, and the indicating device comprises additional indicating elements for indicating the value of the voltage.

18 Claims, 6 Drawing Sheets

PHASE SEQUENCE INDICATOR

BACKGROUND OF THE INVENTION

Such a phase sequence indicator is known from DE-U 87 09 815. Said device has two measuring contacts that have to be brought into contact with two connection of the rotary field to be measured. Through an internal phase-shifted addition of the voltages applied to the measuring contacts it is possible to distinguish between right rotary field and left rotary field and to obtain a corresponding indication. Said distinction between right and left rotary field is made in that a high level of phase-shifted added voltages is classified as a right rotary field and a low level as a left rotary field. However, it is possible in this connection to face the problem that when the two measuring tips are contacted with other voltages not conforming to a three-phase mains of 380 volts, but for example to an AC mains of 220 volts, the level of the phase-shifted added voltages is erroneously classified, for example as a left rotary field, and a corresponding indication is given even though no rotary field is present at all.

SUMMARY OF THE INVENTION

The present invention makes available a phase sequence indicator with which the risk of an erroneous assessment of the direction of the rotary field by the user is reduced.

For said purpose, the phase sequence indicator according to the invention has, according to one embodiment of said invention, an additional voltage testing circuit for detecting the value of the voltage. As the voltage testing circuit is a component of the evaluation circuit, the voltage to be tested is applied via the same measuring contacts as for the indication of the direction of the rotary field. Thus the measuring contacts are jointly used, so that no additional measuring contacts are required. Moreover, the indicating device is equipped with additional indicating elements for indicating the value of the voltage. In addition to obtaining the indication of the direction of the rotary field the user hence advantageously receives also an indication of the voltage present between the measuring contacts. This means that the user can visually determine whether a three-phase mains is in fact present or an AC mains of, for example 220 or 110 volts, or even a DC mains of a lower amplitude. If the user finds such potential values deviating from 380 volts, it will be obvious at the same time that the indication of the direction of the rotary field is meaningless in this case and that it can be ignored.

By way of example, the voltage testing circuit can be embodied as specified in DE 28 46 675 C3. Preferably, the indicator system is provided with an LED luminous band indication for displaying the value of the voltage. Such a luminous band indicator preferably contains LED's for the following voltages and, if need be, polarities: 380 V, 220 V, 110 V, 50 V, 24 V, 12 V, +6 V, −6 V.

In a preferred embodiment, the voltage testing circuit is connected to the measuring contacts via a full-wave rectifier circuit, so that the voltage is measured independently of the actual association between measuring contacts, on the one hand, and the connections of the circuit to be measured on the other hand.

According to another aspect of the present invention, the phase sequence indicator is equipped with an internal voltage source, whereas the evaluation circuit has an electronic switching device for controlling the power supply of the indicator by the internal voltage source, said electronic switching device being connected to the complex input potential divider. Through said measures, for which provision can be made also independently of the voltage testing circuit, it is possible to assure that the indicator device can be caused to illuminate in a stable and reliable way and without flickering in order to indicate a right or left rotary field. Moreover, it is now no longer necessary to feed the current required for operating the indicator device from the tested external circuit, so that the indicator according to the invention can be equipped with a very high ohmic input.

In a preferred embodiment, an additional smoothing circuit is present by way of which it is possible to obtain a control voltage with clearly reduced amplitude variations for controlling the electronic switch for controlling the power feed of the indicator device. Stable switching processes are assured in this way. The stability and definiteness of the switching processes and switching conditions of the electronic switch are further enhanced by the use of a threshold level switch. In this connection, it is possible to obtain through simultaneous impedance conversion an adaptation of the impedance of the input circuit to the electronic switching device and indicator, or a low ohmic output.

Advantageously, provision is made to switch on the internal voltage source only when the voltage on the tap of the complex potential divider is above a certain value. The overall load of the internal voltage source is reduced by such selective switching, i.e., by turning it on only when it is needed. Also, it is possible to definitely assure in this way that the indicator device is kept completely currentless when it is not expected to illuminate. Said switchoff of the internal voltage source can be achieved in a preferred embodiment via an RC circuit that is connected to the control input of the switch of the voltage source and thus controls the switching condition of the latter. Such RC circuit maintains the switch in the charged condition in the blocked condition and brings the switch in the closed condition only when the capacity is discharged. In a preferred embodiment, such discharge can be achieved with potential separation via an opto-coupler which, at higher input voltages, short-circuits the capacity preferably periodically and thus discharges it.

According to another embodiment, a rectangular generator for controlling the indicator device is present, so that the latter can be caused to flash in a defined way with a predetermined frequency and predetermined keying ratio in order to indicate, for example a left rotary field. In the presence of a right rotary field it is possible, for example, to illuminate the indicator continuously. The latter can be achieved in a simple manner by switching off the rectangular generator, so that the current consumption of the latter is interrupted during the indication of a right rotary field as well, which relieves the internal voltage source.

Preferably, a voltage detection circuit is connected to a resistor connected in series with the grounding contact, which voltage detector circuit, in a functionally highly reliable and simple embodiment, can be designed as a differential amplifier connected to the two connections of the resistor. It is possible through such voltage detection to detect whether the grounding contact is in fact touched by the user, because a current can flow via the grounding contact and thus through the resistor only in that case. Through this additional checking of the correct handling of the indicator, namely of the contacting of the grounding contact on the user side it is possible to obtain a control signal for the evaluation circuit which the latter can evaluate in a suitable way, for example by sending an indication reading "touch grounding contact" or the like. Also, it is possible through said detection signal to suppress a faulty reading as it can be caused, for example due to the voltage shifts caused by the missing contact with the grounding contact. For example, when contact with the grounding contact is missing, the rectangular generator can be switched off, so that an erroneous indication of a left rotary field or also of a right rotary field can be suppressed.

Furthermore, it is possible also to additionally or alternatively interrupt the voltage supply of the indicator completely if it is found that contact with the grounding contact is missing, so that the indicator device is completely blocked.

In order to obtain a defined switching behavior, i.e., a defined output signal of the voltage detector circuit, the latter is preferably connected on the output side to a threshold level switch of which the output signal has defined limits, and effects a defined control of the components connected downstream.

In order to supply the user with a defined information as to whether right or left rotary field is present, the indicator, according to another embodiment, may be connected also to two parallel indicator devices for right and left rotary fields, of which devices will be always illuminated when a rotary field is contacted. Enhanced distinctness and clarity of the indication is obtained in this way.

Moreover, according to another embodiment, provision is made for adding a PTC-resistor in the input lines, so that even in case of error, the short-circuit current is reduced in the following circuit parts to a measure that is harmless to the user when a short circuit occurs. This further increases the overall obtainable operational safety.

BRIEF DESCRIPTION OF THE DRAWINGS

The invention is explained in greater detail in the following on the basis of an exemplified embodiment shown in the drawing, in which.

DESCRIPTION OF THE PREFERRED EMBODIMENTS

Figure 1:
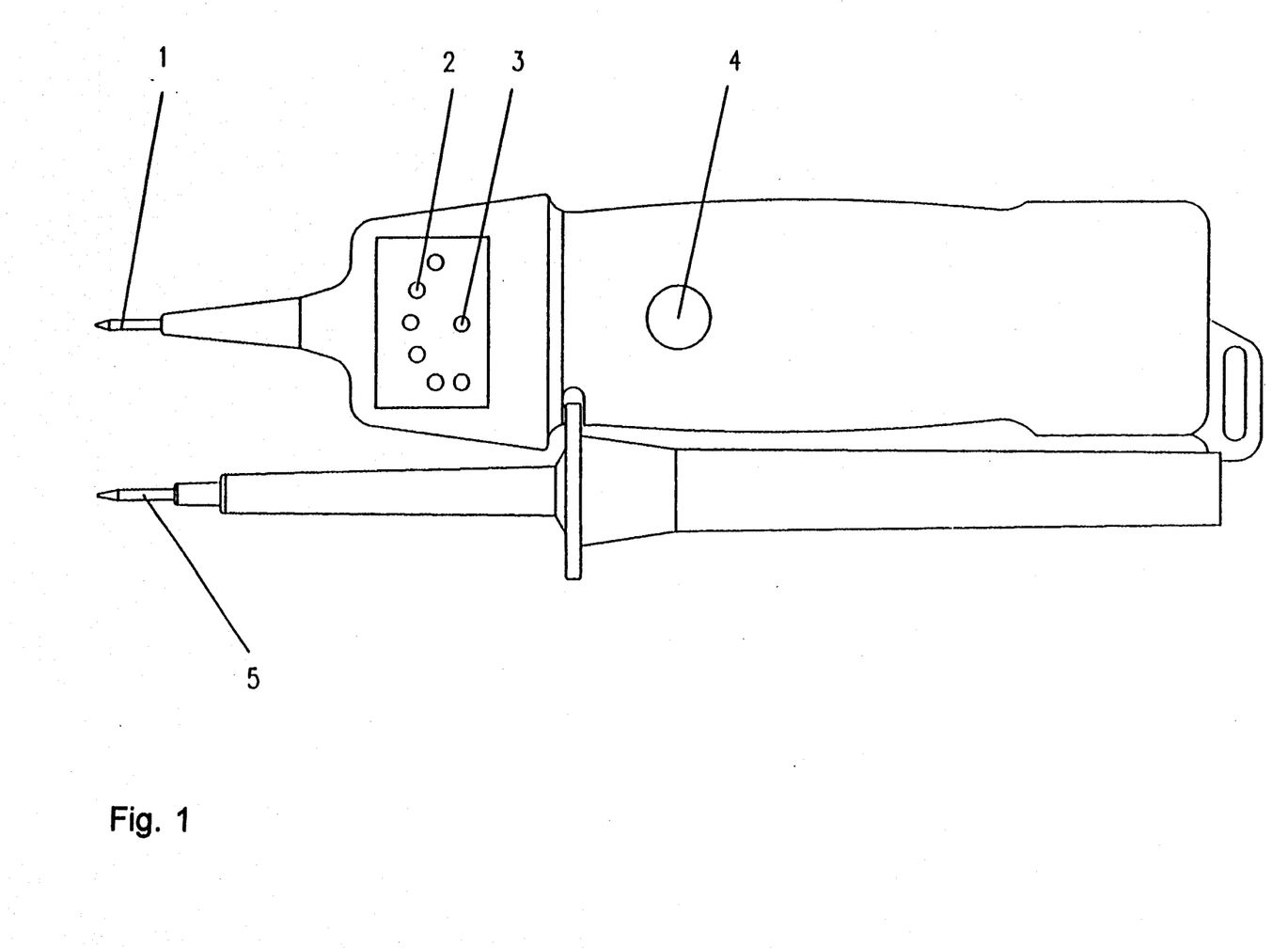
FIG. 1 shows a top view of an exemplified embodiment of the phase sequence indicator according to the invention.

The exemplified embodiment of the phase sequence indicator according to the invention shown in FIG. 1 in an external view is designed as a two-pole phase sequence indicator with voltage tester. The measuring device has two test points 1, 5, which have to be connected to voltage connections of the circuit or mains to be measured. In this connection, the test point 1 conforms to an input connection A in the FIGS. 2 to 6, whereas the test point 5 corresponds with an input connection B in FIGS. 2 to 6. Furthermore, the measuring device has an indicating device 2, 3 with an LED luminous band indication 2 for voltage testing and indication, as well as an indication 3 for indicating the direction of the rotary field. The LED's of the luminous band indication 2, which are arranged in a curved form, each are associated with different voltage values, e.g. 380 V, 220 V, 110 V, 50 V, 24 V, 12 V, −6 V, +6 V. The polarity is thus indicated in the low-voltage range as well.

In addition, the measuring device is equipped with a contact electrode 4 which normally has to be touched by the user when a measurement is carried out, said electrode representing the grounding contact.

Figure 2:
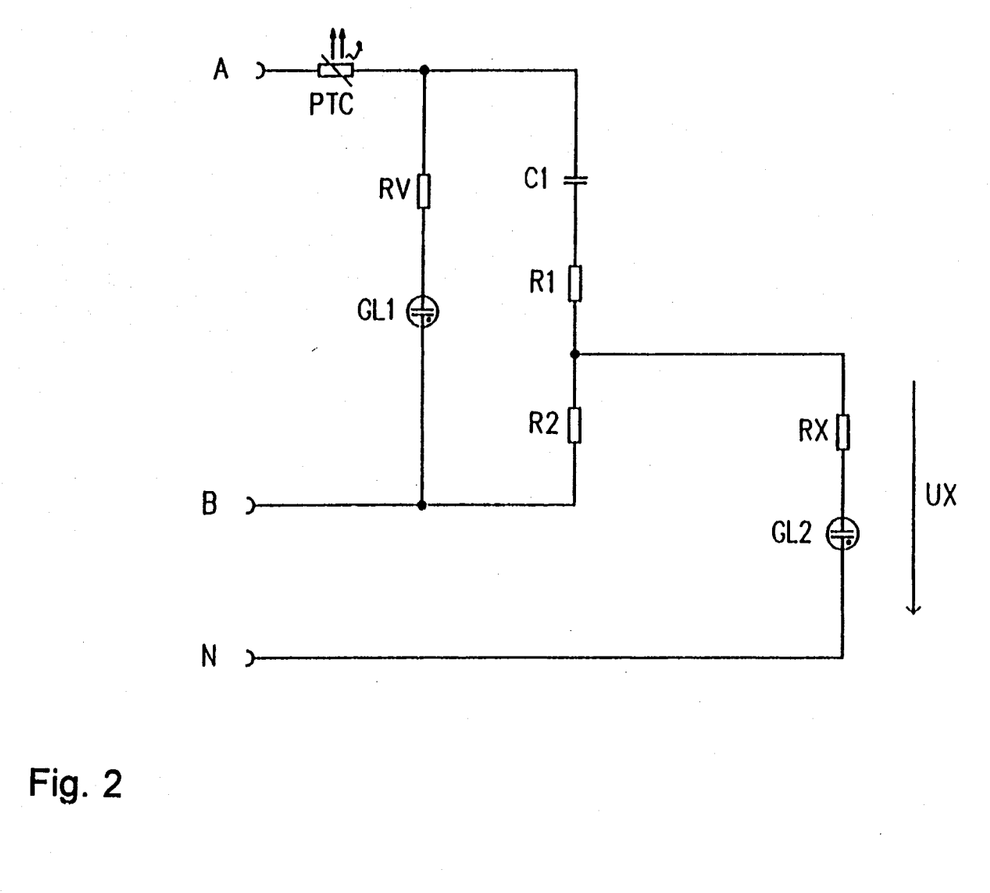
FIG. 2 shows a basic circuit of the indicator for indicating the direction of the rotary field.

FIG. 2 shows a basic circuit for the indication of the rotary field. Between two input connections A, B corresponding with the test points 1, 5, a complex potential divider in the form of a series connection of a capacitor C1 and two series-connected resistors R1, R2 is connected, with a series connection consisting of a resistor RX and a glow lamp GL2 being interconnected between the tap of said potential divider and a grounding connection N, which is connected to the grounding contact 4. The glow lamp GL2 conforms to the indicating element 3 according to FIG. 1. The complex potential divider consisting of the components R1, R2, C1 substantially represents the circuit for detecting the direction of the rotary field of a three-phase mains, whereby the phase position of the input voltage on connection A is shifted against ground or neutral conductor by the series-connected capacitor. The result is thus a complex addition of the individual voltages L1, L2 applied to the connections A, B, as well as of the part voltages with their phase angles associated in each case, which causes a voltage UX to occur between the tap on the point of connection between the resistors R1, R2, on the one hand, and the grounding contact on the other hand, said voltage being applied to the series connection RX, GL2. In this connection, the circuit is dimensioned in such a way that the phase voltage L1 is applied to connection B and the phase voltage L2 to connection A (right rotary field), a voltage drop UX occurs that is sufficiently large to cause the glow lamp GL2 to illuminate. On the other hand, when the phase voltages are connected to the inputs A, B in such a way that a left rotary field is applied, the phase voltage applied to connection A is shifted via the capacitor C1 in such a way that it is substantially in counterphase to the phase voltage applied to connection B, so that the voltage drop UX is so small that the glow lamp GL2 is not illuminated.

A series connection consisting of a resistor RV and a glow lamp GL1 is arranged parallel with the series connection C1, R1, R2. The resistor RV and the glow lamp GL1 form an indication indicating whether the connections A, B are correctly contacted, and at the same time represent a safety circuit in the form of an indication for dangerous contact voltages. Preferably, RV and GL1 are dimensioned in such a way that the glow lamp GL1 illuminates when the voltage applied to the series connection RV, GL1 is higher than 60 volts. Thus the glow lamp GL1 forms a visual warning signal for voltages exceeding said value.

A PTC-resistor PTC is connected in series with the connection A for limiting in case of error the short-circuit current that may occur in the following circuit to a measure harmless to the user.

If the connection B is contacted by the phase L1, L2 or L3, and the connection A is simultaneously contacted by the phase L2, L3 or L1, this will correspond with a right rotary field with a large voltage drop UX. On the other hand, contacting of the connection B with the phase L2, L3 or L1 with simultaneous contacting of connection A with phase L1, L2 or L3 conforms to a left rotary field with a small voltage drop UX, so that the glow lamp GL2 is not illuminated.

However, because of the dimensioning of the circuit according to FIG. 2, the voltage UX is not very stable under load, so that the use of the glow lamp GL2 for indicating the direction of the rotary field is problematic in practical application. Also, it may be that the glow lamp is poorly readable under outside light. For this reason, the voltage drop UX can be loaded only in a highly ohmic way. In order to counter said problems, use is made according to FIGS. 3 ff of an electronic evaluation circuit that permits an always uniform clear indication of the rotary-field direction, for example over a very bright LED.

Figure 3:
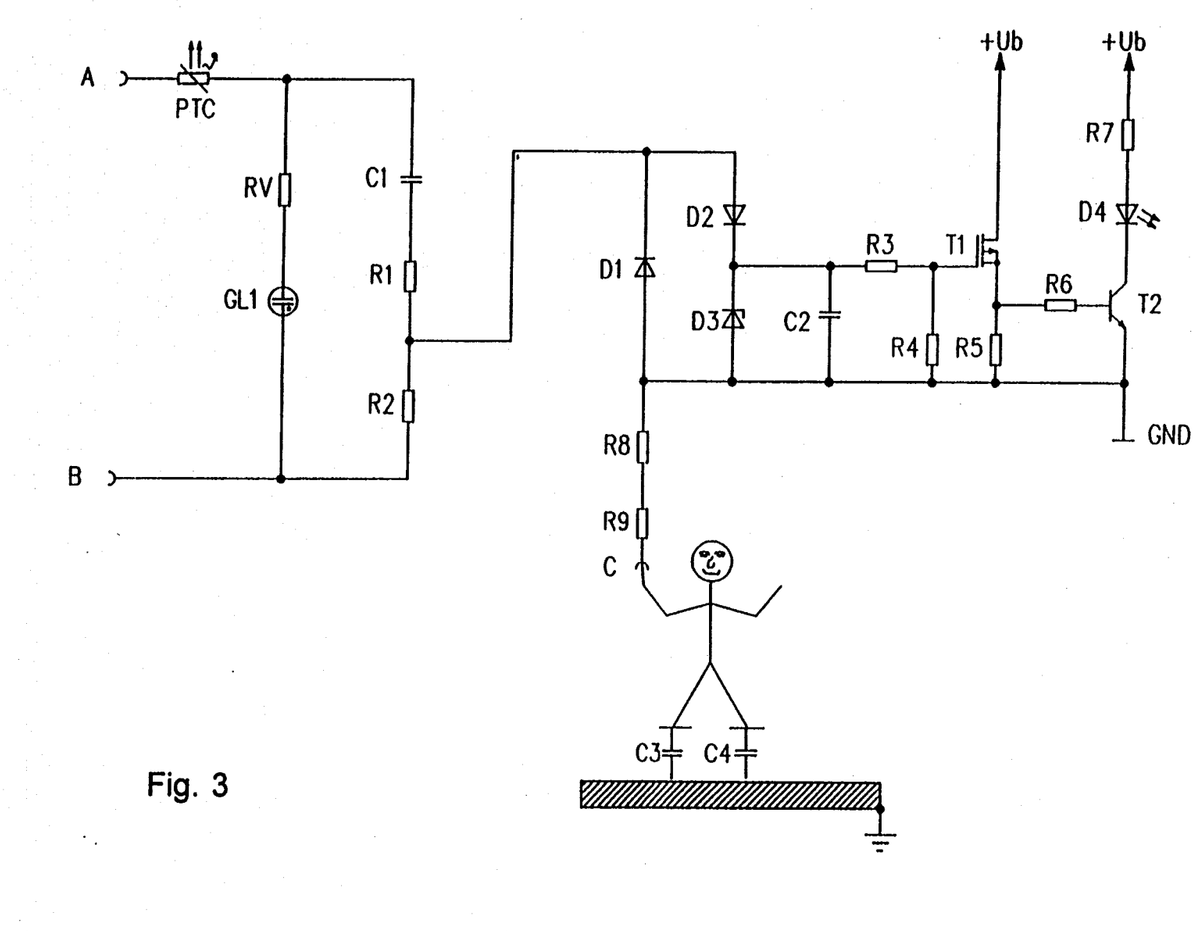
FIG. 3 shows a circuit diagram of an exemplified embodiment of the phase sequence indicator according to the invention.

With the circuit according to FIG. 3, the resistor RX and the glow lamp GL2 are consequently replaced by an electronic circuit with an internal voltage supply source +Ub. The internal voltage source is preferably formed by a battery. A series connection consisting of a diode D2, a Zener diode that is connected in the opposite direction relative to the diode D2 and connected to the cathode of the latter, and the two resistors R8, R9 is connected to the connection between the resistors R1 and R2, whereby the other connection of the resistor R9 is connected to a grounding contact C conforming to the contact 4 according to FIG. 1. When a right rotary field is applied between the connections A, B, for example when the phase L1 is contacted with the connection B and the phase L2 with the connection A, current flows in connection with the positive half-wave from the tap between the resistors R1, R2 via the rectifier diode D2 and the Zener diode D3 and the resistors R8 and R9 via the human body and the coupling capacities—which are schematically shown as parallel-connected coupling capacities C3 and C4—to earth, whereby the current flowing through the human body is limited to the required extent by the resistors R8 and R9. With this, a voltage occurs on the Zener diode D3 serving for limiting the voltage, so that a voltage builds up also via a smoothing capacitor C2 that is connected in parallel with said diode. The smoothing capacitor C2 and the resistance-voltage dividers R3, R4 connected in parallel with said capacitor C2 jointly form a smoothing circuit for smoothing the voltage.

The control electrode of an electronic switch in the form of an MOS field effect transistor T1 is connected to the tap between the resistors R3 and R4; the drain connection of said transistor is connected to the internal voltage source +Ub, and its source connection is connected via a resistor R5 to an internal neutral conductor of the internal voltage source, said neutral conductor also contacting a connection of the resistor R8, of the Zener diode D3, of the smoothing capacitor C2, and of the resistor R4. The transistor T1 becomes conductive when the voltage occurring on the tap of the potential divider R3, R4 exceeds its threshold voltage, and thus acts as a threshold switch. In the conductive state of the transistor T1, the latter conducts via a resistor R6, the latter being connected to its source connection, basic current to a bipolar transistor T2 serving as an electronic switch. The collector-emitter section of the transistor D2 is connected in series with an LED D4 and a resistor R7 connected to the internal voltage source, so that when the transistor T2 is switched through, current flows through the LED D4 and the latter is illuminated, i.e., indicating a right rotary field. The field effect transistor T1 and the resistor R5 jointly form an impedance converter.

Parallel with the series connection consisting of the diode D2 and the Zener diode D3, a diode D1 is connected in the opposite direction to the diode D2, so that the negative voltage half-wave does not act on the rectifier circuit D2, D3 and the smoothing circuit, but is short-circuited with respect to said components by the diode D1. This means that the negative half-wave is not used.

When a left rotary field is applied to the connections A, B, the voltage drop on the Zener diode D3 is so small that the smoothing capacitor C2 is not charged or charged only so weakly that the threshold voltage of the transistor T1 is not reached. The LED D4 consequently remains switched off in this case.

Figure 4:
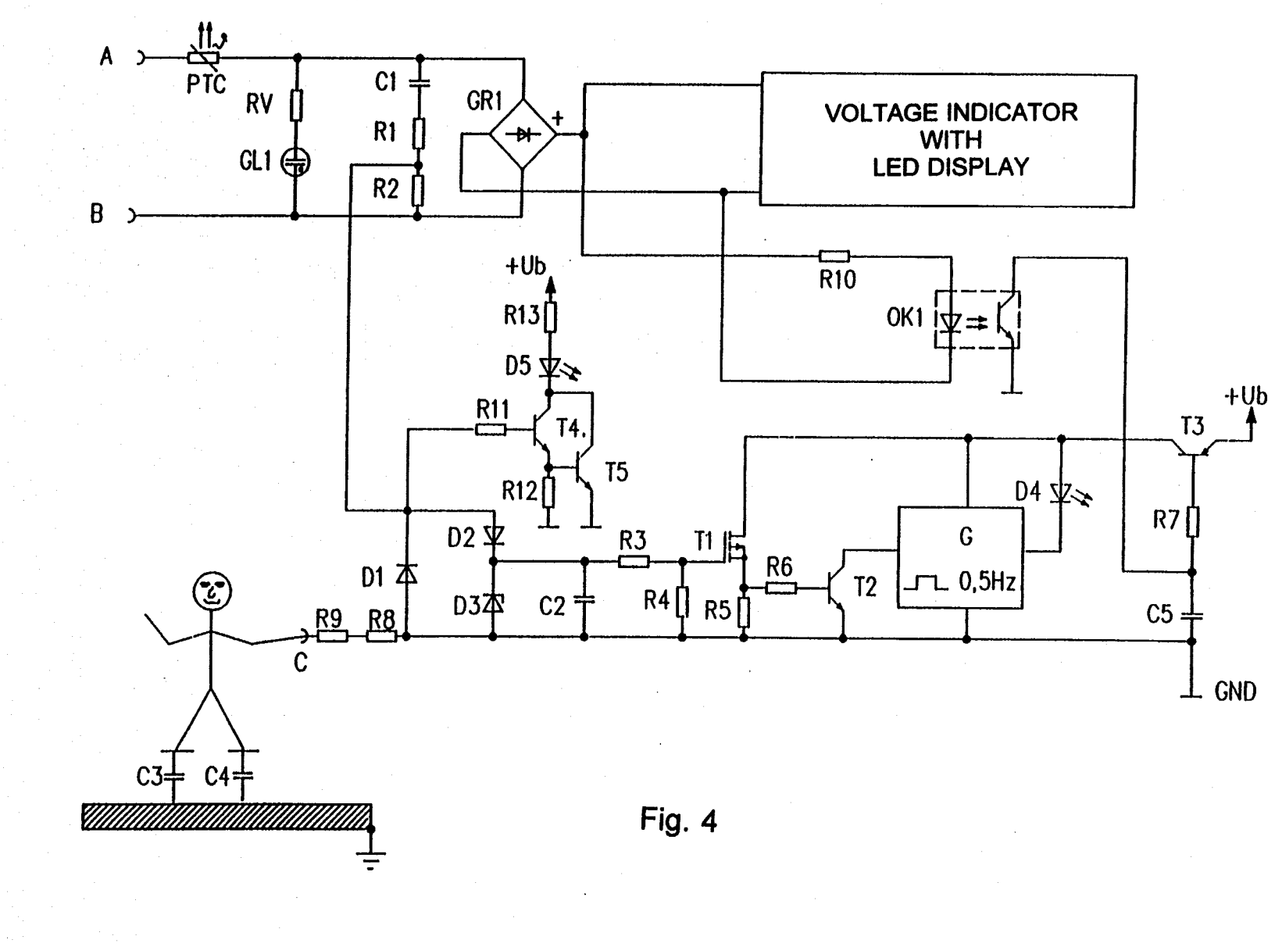
FIG. 4 shows another exemplified embodiment of the circuit arrangement of a phase sequence indicator according to the invention.

The exemplified embodiment of the circuit of the measuring device of the invention shown in FIG. 4 is based on the circuit according to FIG. 3 and is provided with the following additional components: a full-wave rectifier GR1 is connected between the connections A, B in series with the PTC-resistor; the full-wave rectified output voltage of said rectifier GR1 feeds, as shown, a voltage tester with LED luminous band indication. The voltage tester contains a voltage-testing circuit which detects the effective value of the three-phase voltage or AC voltage, or in case of DC voltage the amplitude and, if need be, the polarity, and supplies via the LED luminous band indication an indication of the detected voltage level and polarity, if necessary. In this way, the voltage applied between the connections A, B is indicated to the user in addition to the indication of the direction of the rotary field. The voltage-testing circuit may contain a microprocessor to which the full-wave rectified voltage is supplied; said microprocessor classifies said voltage according to its amplitude value and controls the LED associated with the value of the voltage.

Furthermore, the input of an opto-coupler OK1 is connected with the output connections of the full-wave rectifier GR1 via a series resistor R10, with the output transistor of said opto-coupler being connected in parallel with a capacity C5. The capacity C5 together with a series resistor R7 is connected between the control connection of an electronic switch in the form of a transistor T3, on the one hand, and the neutral conductor GND of the internal voltage source, on the other hand. The capacity C5 of the RC-member R7, C5 is charged—with the opto-coupler in the blocked state—via the basic current of transistor T3 to a potential such that the voltage of transistor T3 falls short of its threshold level, which puts the latter in the blocked condition. With transistor T3 in the blocked state, the collector-emitter section of transistor T3 that is connected between the internal voltage source +Ub, on the one hand, and the cathode of LED D4 and the drain connection of field effect transistor T1 on the other hand, thus breaks the current supply of LED D4 and transistor T1, as well as of a rectangular generator G that is described in greater detail hereinafter. If, on the other hand, a voltage is applied between the connections A and B, an output voltage occurs on the output of rectifier GR1 which, if sufficiently high, activates the opto-coupler OK1, so that its LED will flash every 10 ms (at a mains frequency of 50 Hz) and the output transistor of optp-coupler OK1 will thus become conductive every 10 ms and short-circuit the capacity C5. The RC-member R7, C5 is dimensioned in such a way that the capacity C5 cannot charge itself within 10 ms to a value sufficient for blocking the transistor T3. In this way, with voltage applied to the connections A, B, the transistor T3 is continuously maintained in the conductive state, so that the circuit for detecting and and indicating the direction of the rotary field is fed with operating voltage +Ub of the battery.

According to FIG. 4, the evaluation circuit, furthermore, contains a rectangular generator G which generates square-topped pulses with a frequency of 0.5 Hz. When the switch T3 is closed, the rectangular generator G is supplied with voltage by the battery. The transistor T2 is connected to a control input of rectangular generator G. As described in connection with FIG. 3, the transistor T2 becomes conductive in the presence of a right rotary field and thereby shuts the rectangular generator G off. In this case, LED D4 will be illuminated continuously. However, if the transistor T2 is blocked, which is the case when a left rotary field is applied to the connections A and B, the rectangular generator G is activated and connects the LED D4 to mass potential in tune with its frequency, so that in the presence of a left rotary field, the diode D4 will flash with the frequency of rectangular generator G. Consequentlyan indication is given both with a right and left rotary field; however, said indications are clearly distinguishable from each other.

The circuit arrangement according to FIG. 4 addionally permits a one-pole test via the additional components R11 to R13, T4, T5, D5. The resistor R11 is connected between the anode of diode D2 and the control connection of transistor T4, with the emitter of the latter being connected to the emitter resistor R12 and the base of transistor T5. The collectors of the transistors T4, T5 are jointly coupled with the cathode of an LED D5, whose anode is connected to the internal voltage source +Ub via a resistor R13. If one of the connections A, B, for example connection A is applied to voltage, for example to phase L1, current flows during the positive half-wave via the components C1, R1, D2, D3, R8, R9, the human body and the coupling capacities C3, C4 to earth. At the same time, a voltage drop occurs on the anode of diode D2 that controls the transistor T4 and thus also the transistor T5, causing the LED D5 to illuminate. Hence the measuring device according to the invention can be used like a conventional single-pole voltage tester, whereby it is necessary only to use one of the test points 1, 5 and to touch the grounding contact 4.

Figure 5:
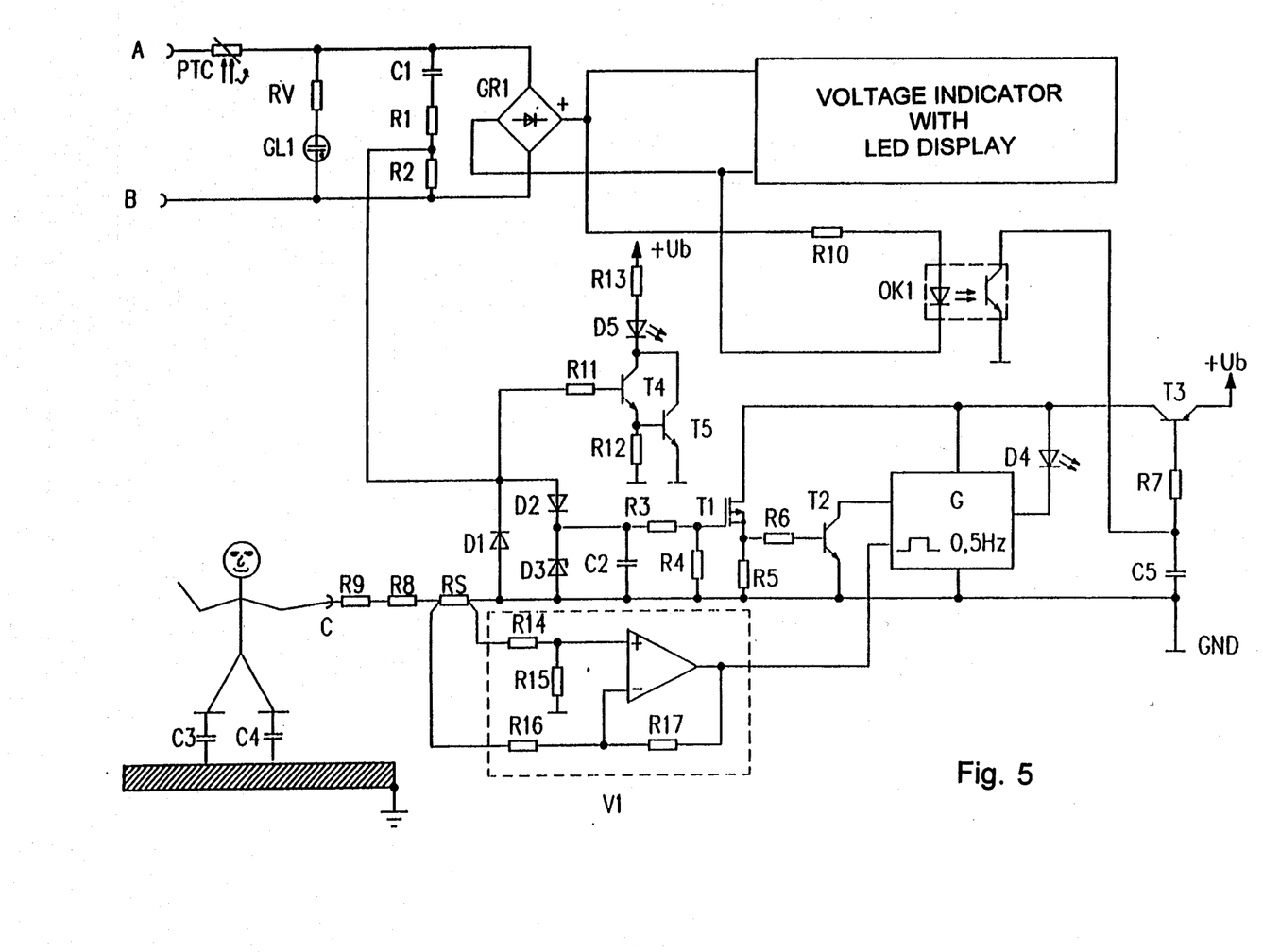
FIG. 5 shows a circuit diagram of an exemplified embodiment with additional grounding current detection.

With the circuit according to FIG. 4 it may be possible to encounter the drawback that when phase L1 or L2 is applied to connection B and phase L2 or L1 to connection A without touching the grounding electrode 4 (connection C), LED D4 may flash, erroneously signalling a left rotary field. In order to eliminate said problem, the circuit of the exemplified embodiment according to FIG. 5 is supplemented by an additional resistor RS and a voltage detector circuit in the form of a differential amplifier V1, which controls the rectangular generator G. The other components of the circuit according to FIG. 5 conform to those according to FIG. 4 and are, therefore, not described again.

The shunt resistor RS is connected in series with the resistors R8, R9, whereby its two connections are connected to the inputs of the differential amplifier V1. The latter has an input voltage divider R14, R15, whose tap is connected to the non-inverting input of an operation amplifier, of which the output is coupled back to the inverting input via a resistor R17. Furthermore, the inverting input is connected to the other connection of resistor RS via a resistor R16. The output is differential amplifier V1 is coupled with another control connection of rectangular generator G. Only if the grounding contact C (touch electrode) is touched by the user can current flow through the resistor RS, so that a voltage drop will occur on the latter. Said voltage drop is detected by the differential amplifier V1, so that the latter emits a positive output signal. Otherwise, i.e., if the touch electrode is not touched and the resistor RS is thus currentless, no output signal is emitted by the differential amplifier V1.

The rectangular generator G is made up structurally in such a way that the input signals that are supplied to it by the transistor T2 and the differential amplifier V1 are linked up with one another by said generator in a way such that the LED D4 is capable of illuminating or flashing only if a voltage drop is detected on resistor RS, i.e., if the touch electrode is touched and current flows through the human body.

Figure 6:
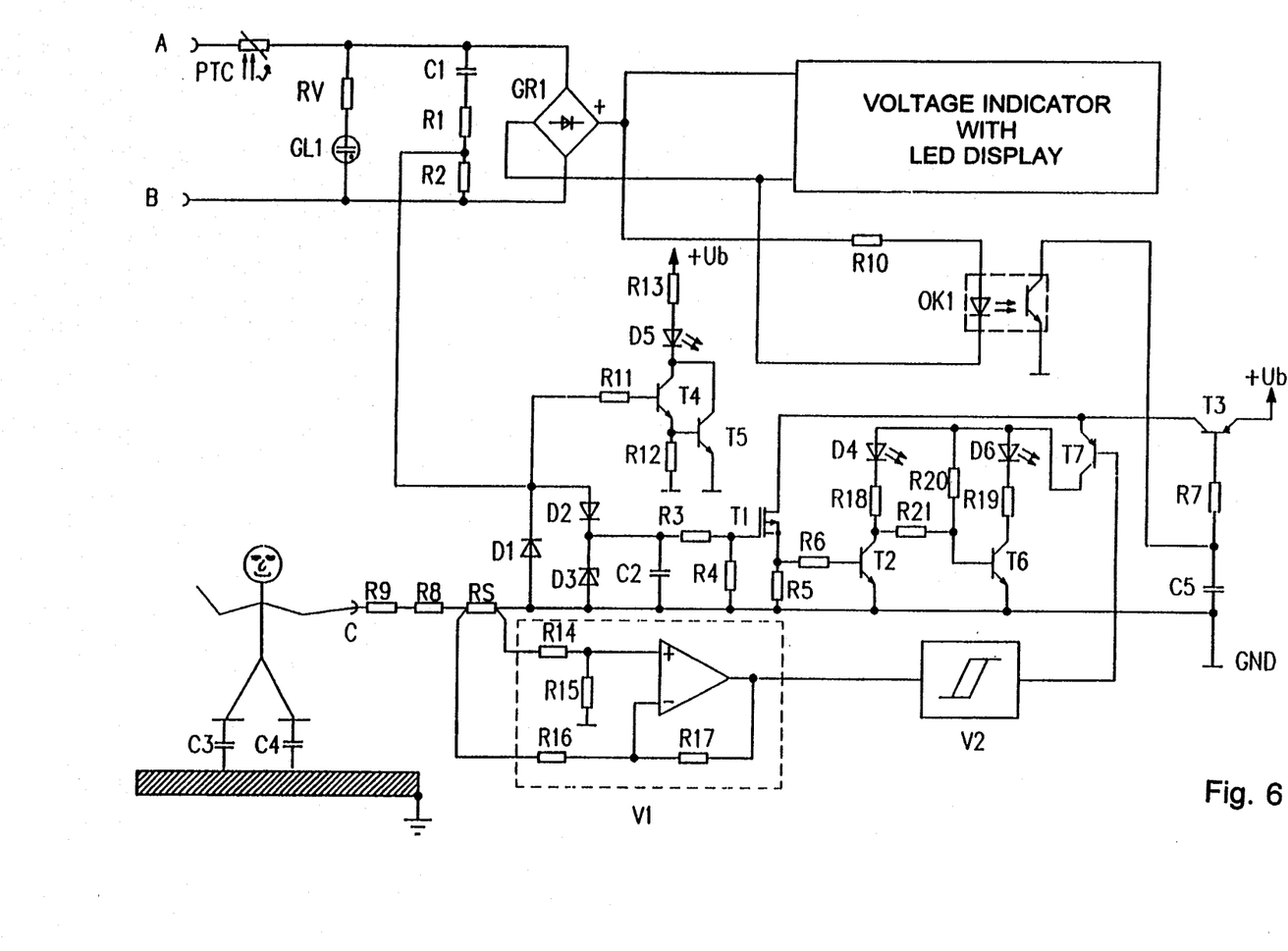
FIG. 6 a circuit diagram of another exemplified embodiment of the phase sequence indicator according to the invention.

The exemplified embodiment of the circuit of a measuring device according to the invention as shown in FIG. 6 is different from the circuit diagram according to FIG. 5 in that the rectangular generator G is replaced by the resistors R18 to R21 and the transistors T6, T7. Furthermore, an additional LED D6 is present, and a threshold switch V2 is connected to the output of the differential amplifier V1. In all other respects, the circuit according to FIG. 6 corresponds with the one according to FIG. 5, so that corresponding parts are not described again.

The threshold switch V2 with hysteresis transforms the output signal of differential amplifier V1 into a signal with defined limits and a stable signal condition; said signal serves for controlling the transistor T7 acting as an electronic switch. The LED's D4, D6 of the transistors T2, T6 and the resistors R18 to R21 are supplied with current via the transistor T7. If input voltage is missing on the connections A, B, or touching of grounding contact C is missing, the transistor T7 is switched off, so that the LED's D4, D6 are kept free of voltage and are not illuminated. LED D4 serves for indicating a right rotary field, whereas LED D6 serves for indicating a left rotary field. As described herein earlier, the transistor T2 becomes conductive when a right rotary field is applied to connections A, B. In that case, current flows through LED D4 and the resistor R18 connected in series to the latter, so that the LED D4 illuminates. Switching of the transistor T2 ensures, furthermore, that the transistor T6 is blocked via the resistor R21 connected between the collector of transistor T2 and the base connection of transistor T6. Thus the LED D6 remains switched off. If instead a left rotary field is applied to the connections A, B, the transistor T2 is not switched through, so that the LED D4 is blocked. this case, basic current can flow to transistor T6 via a resistor R20, so that said transistor T6 becomes conductive and current flows through the LED D6 and the resistor R19 connected in series to the latter.

The phase sequence indicator according to the invention thus permits simple testing of the right rotary field by means of the integrated two-pole indicator of the direction of the rotary field, whereby checking of the direction of the rotary field is particularly simple and safe because it can be carried out with two hands, i.e., no helper or other aid is required. Moreover, with voltages above 60 volts, a visual warning signal is given via the glow lamp GL1. In addition, it is possible via the integrated voltage tester to carry out without problems all usual voltage tests with automatic range changeover, with the possibility of polarity indication starting with 6 volts AC and DC. In addition, a single-pole voltage test can be carried out.

I claim:

1. A phase sequence indicator consisting of
two measuring contacts (1, 5; A, B) for connecting with connections of an object to be measured, a contact electrode (4; C) positioned on said phase sequence indicator so as to be touchable by the user when a measurement is being carried out,
an evaluation circuit (C1, C2, D1 to D3, R1 to R9, T1, T2) connected to said measuring contacts and said contact electrode, an indicating device (D4, D6) controlled by said evaluation circuit for indicating a direction of a rotary field, said evaluation circuit having a voltage-testing circuit for detecting the value of the voltage occurring between said measuring contacts, and said indicating device including indication elements (2) for indicating the value of a voltage, said phase sequence indicator being operable only when said contact electrode is touched by the user.

2. A phase sequence indicator according to claim 1 in which said indicating device is an LED luminous band indicator (2) for indicating the value of the voltage.

3. A phase sequence indicator according to claim 1 including a full-wave rectifier circuit (GR1), said voltage-testing circuit being connected to said measuring contacts through said full-wave rectifier.

4. A phase sequence indicator according to claim 1 including an internal voltage source and in which said evaluation circuit includes a potential divider (C1, R1, R2) coupled with said measuring contacts, and an electronic switching device for controlling the connection of said internal voltage source to said indicating device.

5. A phase sequence indicator according to claim 4 including a smoothing circuit (D3, C2, R3, R4) connected to said potential divider, said smoothing circuit being in series with said measuring contacts and including a capacity (C1) and two resistors (R1, R2) connected to each other, and a switch (T2) having a control input, said switch controlling said indicating device, said smoothing circuit being coupled with said control input.

6. A phase sequence indicator according to claim 5 including a threshold value switch (T1, R5) connected between said smoothing circuit and said electronic switching device.

7. A phase sequence indicator according to claim 5 characterized in that said smoothing circuit includes a Zener diode (D3) connected in series between said resistors (R1, R2) of said potential divider and said grounding contact (C), and a smoothing capacitor (C2) connected in parallel with said Zener diode.

8. A phase sequence indicator according to claim 4 including an electronic switching device (T3) connected in series with said internal voltage source and a control circuit (OK1, R7, C5) for controlling said electronic switching device, said control circuit responding to the magnitude of the voltage at said potential divider and switching said last-named switch on only above a pre-determined voltage value.

9. A phase sequence indicator according to claim 1, including a rectangular generator (G), and in which said evaluation circuit, upon detection of an input voltage representing a left rotary field, connects said rectangular generator to said indicating device, whereby said indicating device flashes in accordance with the frequency of said rectangular generator.

10. A phase sequence indicator according to claim 9, characterized in that said evaluation circuit, upon detection of an input voltage representing a right rotary field, switches off said rectangular generator and continuously feeds said indicating device with power, whereby said indicating device is continuously illuminated.

11. A phase sequence indicator according to claim 4 including a shunt resistor (RS) connected to said contact electrode, and a differential amplifier (V1), said shunt resistor being coupled to said differential amplifier.

12. A phase sequence indicator according to claim 9, characterized in that said voltage detector circuit is connected to an input of said rectangular generator and blocks the activation of said rectangular generator when a voltage drop is missing on said last-named resistor.

13. A phase sequence indicator according to claim 11 including a voltage supply line switch (T7), characterized in that when a voltage drop is missing on said shunt resistor said voltage detector circuit opens said electronic switching device thereby cutting the power from said indicating device.

14. A phase sequence indicator according to claim 11 including a threshold switch (V2), the output of said voltage detector circuit being connected to said threshold switch.

15. A phase sequence indicator according to claim 4 in which said indicating device includes a first indicating lamp (D4) for right rotary field and a second indicating lamp (D6( for left rotary field, and a transistor circuit (T2, T6) connecting said indicating lamps, said transistor circuit, on activation of one of said indicating lamps, switches of the other of said indicating lamps.

16. A phase sequence indicator according to claim 4 including a PTC-resistor connected in series with one of said measuring contacts.

17. A phase sequence indicator including
two measuring contacts (1, 5; A, B) for connecting with connections of an object to be measured, a grounding contact (4; C) touchable by the user,
an evaluation circuit (C1, C2, D1 to D3, R1 to R9, T1, T2) connected to said measuring contacts and said grounding contact, an indicating device (D4, D6) controlled by said evaluation circuit for indicating a direction of a rotary field, said evaluation circuit having a voltage-testing circuit for detecting the value of the voltage occurring between said measuring contacts, said indicating device including indication elements (2) for indicating the value of a voltage, an internal voltage source, said evaluation circuit including a potential divider (C1, R1, R2) coupled with said measuring contacts, an electronic switching device for controlling the connection of said internal voltage source to said indicating device, said electronic switching device (T3) being connected in series with said internal voltage source, a control circuit (OK1, R7, C5) for controlling said electronic switching device, said control circuit responding to the magnitude of the voltage at said potential divider and switching said electronic switching device on only above a pre-determined voltage value, said control circuit including an RC-circuit (R7, C5) connected to the control connection of said electronic switching device, said RC-circuit keeping said electronic switching device in the blocked state when the capacity (C5) of said RC-circuit is charged, and said control circuit discharging said last-named capacity at input voltages above said pre-determined voltage value.

18. A phase sequence indicator according to claim 17 including an opto-coupler (OK1), the input of said opto-coupler being connected to a rectifying circuit (GR1) for rectifying said input voltage, the output of said rectifying circuit being in parallel with said capacity (C5) of said RC-circuit.

* * * * *